United States Patent
Bian et al.

(10) Patent No.: US 11,495,700 B2
(45) Date of Patent: Nov. 8, 2022

(54) PHOTODETECTORS AND SEMICONDUCTOR DEVICES

(71) Applicant: GLOBALFOUNDRIES U.S. INC., Santa Clara, CA (US)

(72) Inventors: Yusheng Bian, Ballston Lake, NY (US); Ajey Poovannummoottil Jacob, Watervliet, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 378 days.

(21) Appl. No.: 16/798,417

(22) Filed: Feb. 23, 2020

(65) Prior Publication Data
US 2021/0265513 A1    Aug. 26, 2021

(51) Int. Cl.
| | |
|---|---|
| H01L 31/0232 | (2014.01) |
| H01L 31/028 | (2006.01) |
| G02B 6/122 | (2006.01) |
| G02B 6/12 | (2006.01) |
| G02B 6/42 | (2006.01) |

(52) U.S. Cl.
CPC ...... *H01L 31/0232* (2013.01); *G02B 6/12004* (2013.01); *G02B 6/1228* (2013.01); *G02B 6/42* (2013.01); *H01L 31/028* (2013.01); *H01L 31/02327* (2013.01)

(58) Field of Classification Search
CPC .......... G02B 6/12004; G02B 6/12107; G02B 6/124; H01L 31/02327
See application file for complete search history.

(56) References Cited

U.S. PATENT DOCUMENTS

| | | | |
|---|---|---|---|
| 7,120,350 B2 | 10/2006 | Block et al. | |
| 9,229,164 B2 | 1/2016 | Assefa et al. | |
| 9,356,164 B2 | 5/2016 | Assefa et al. | |
| 2003/0026566 A1* | 2/2003 | Diep ................. | G02B 6/02266 385/124 |
| 2017/0108375 A1* | 4/2017 | Brueck ................. | G02B 6/124 |

OTHER PUBLICATIONS

M. Moayedi Pour Fard et al. High-speed grating-assisted all-silicon photodetectors for 850 nm applications. Optics Express, 25:5: 5107-5118, Mar. 6, 2017. https://doi.org/10.1364/OE.25.005107 (Year: 2017).*

(Continued)

*Primary Examiner* — Michael Stahl
(74) *Attorney, Agent, or Firm* — David Cain (57) ABSTRACT

The present disclosure generally relates to structures for use in optoelectronic/photonic applications and integrated circuit (IC) chips. The present disclosure also relates to semiconductor devices having a photodetector coupled with a waveguide, more particularly, a photodetector with a butt-end coupled waveguide. The present disclosure provides a structure having a substrate, a photodetector arranged above the substrate, the photodetector having a core body and a coupler that is adjacent to the core body, in which the core body is configured to absorb light received by the coupler, and the coupler including a plurality of grating structures having respective widths that vary as a function of position relative to the core body.

20 Claims, 9 Drawing Sheets

(56) References Cited

OTHER PUBLICATIONS

J. Gonzalez Marin et al. MoS2 photodetectors integrated with photonic circuits. NPJ 2D Materials and Applications, 3:14, Mar. 29, 2019. https://doi.org/10.1038/s41699-019-0096-4 (Year: 2019).*

Ken Giewont et al., 300-mm Monolithic Silicon Photonics Foundry Technology, IEEE Journal of Selected Topics in Quantum Electronics, Sep./Oct. 2019, 1-12, vol. 25, No. 5, IEEE, New Jersey, United States.

Solomon Assefa et al., CMOS-integrated high-speed MSM germanium waveguide photodetector, Optics Express, Mar. 1, 2010, 4986-4999, vol. 18, No. 5, OSA, United States.

Yong-Hwan Kwon et al., Fabrication of 40 Gb/s Front-End Optical Receivers Using Spot-Size Converter Integrated Waveguide Photodiodes, ETRI Journal, Oct. 2005, 484-490, vol. 27, No. 5.

Long Chen et al., High performance germanium photodetectors integrated on submicron silicon waveguides by low temperature wafer bonding, Optics Express, Jul. 21, 2008, 11513-11518, vol. 16, No. 15, OSA, United States.

Ruijun Wang et al., III-V-on-Silicon Photonic Integrated Circuits for Spectroscopic Sensing in the 2-4 μm Wavelength Range, Sensors, 2017, 1-21, MDPI, Basel, Switzerland.

Kazuya Ohira et al., On-chip optical interconnection by using integrated III-V laser diode and photodetector with silicon waveguide, Jul. 19, 2010, 15440-15447, vol. 18, No. 15, OSA, United States.

\* cited by examiner

PHOTODETECTORS AND SEMICONDUCTOR DEVICES

FIELD OF THE INVENTION

The present disclosure generally relates to structures for use in optoelectronic/photonic applications and integrated circuit (IC) chips. The present disclosure also relates to semiconductor devices having a photodetector coupled with a waveguide, more particularly, a photodetector with a butt-end coupled waveguide.

BACKGROUND

Semiconductor detectors, such as photodetectors, are sensors that detect light or other electromagnetic energy and may typically be found in optoelectronic or photonic devices that are manufactured using semiconductor processes. The use of such devices in high-speed switching and transceiver devices in data communications are but a few examples that highlight the advantages of processing both optical and electrical signals within a single integrated circuit (IC) device.

An integrated photonic device may include a photodetector and an optical component (e.g., a waveguide) fabricated on a single substrate. The waveguide serves as a channel to guide electromagnetic waves into the photodetector by confining the waves to propagate in one dimension in order to minimize loss of energy or power. The propagated electromagnetic waves are absorbed by the photodetector. The photodetector may be doped to have a p-n junction that converts photons into current, which is then transmitted to external circuits through contact structures that are formed on the photodetector.

Ideally, it is desirable to have the waveguide and the photodetector achieve a coupling efficiency for the electromagnetic waves as close as possible to 100 percent for both transverse-electric (TE) and transverse-magnetic (TM) polarized modes. However, in practice, the coupling efficiency between the waveguide and photodetector sections is lower due to mismatches in the mode profiles and mode indices during optical transmission of electromagnetic waves, which limits the performance of the photonic device (e.g., loss of energy/power in the photodetector).

Therefore, there is a need to provide structures and semiconductor devices that can overcome, or at least ameliorate, one or more of the disadvantages as described above.

SUMMARY

In an aspect of the present disclosure, there is provided a structure having a substrate, a photodetector arranged above the substrate, the photodetector having a core body and a coupler that is adjacent to the core body, in which the core body is configured to absorb light received by the coupler, and the coupler including a plurality of grating structures having respective widths that vary as a function of position relative to the core body.

In another aspect of the present disclosure, there is provided a structure having a substrate, a photodetector arranged above the substrate, the photodetector having a core body and a coupler that is adjacent to the core body, in which the core body is configured to absorb light received by the coupler, and the coupler including a first plurality of grating structures and a second plurality of grating structures arranged between the first plurality of grating structures and the core body, the first plurality of grating structures having respective widths that vary as a function of position relative to the core body.

In yet another aspect of the present disclosure, there is provided a semiconductor device having a substrate, a photodetector arranged above the substrate, the photodetector having a core body and a coupler that is adjacent to the core body, in which the core body is configured to absorb light received by the coupler, the coupler including a plurality of grating structures having respective widths that vary as a function of position relative to the core body, and an optical component arranged above the substrate and adjacent to the photodetector, in which the coupler receives light transmitted by the optical component.

Advantageously, the present disclosure is found to provide a higher modal effective index of the semiconductor device and an increased effective index match between the waveguides and the photodetector. For example, the provision of a coupler having a plurality of grating structures may enable an increased modal overlap and may also achieve significantly enhanced coupling efficiency between optical components and the photodetector for electromagnetic waves transmitting in both TE and TM modes.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Referring to FIGS. 1A through 1C, and FIG. 2, embodiments of a structure for use in optoelectronic/photonic applications includes a substrate 102 and a photodetector that is arranged above the substrate 102. The photodetector includes a core body 106 and a coupler 108 that is adjacent to the core body 106. The core body 106 may be configured to absorb light received by the coupler 108. To this end, the core body 106 and the coupler 108 may be aligned or substantially aligned along a longitudinal axis 110 of the photodetector.

Although not shown, the core body 106 may be doped to provide a PN or PIN junction for the photodetector, which converts the absorbed photons into electrical current. Contact structures may be formed upon the core body 106 to provide electrical connections for transmission of electrical current to external circuits of semiconductor devices.

The substrate 102 may be made of any semiconductor material, such as silicon, germanium, silicon germanium (SiGe), silicon carbide, and those consisting essentially of III-V compound semiconductors, such as GaAs, II-VI compound semiconductors such as ZnSe. A portion or the entire substrate 102 may be amorphous, polycrystalline, or monocrystalline. A buried insulator layer 104 may be arranged upon the substrate 102. The buried insulator layer 104 may be made of an oxide (e.g., silicon dioxide) or a nitride (e.g., silicon nitride). In some embodiments, the core body 106 and the coupler 108 are both arranged upon the buried insulator layer 104. As will be shown in subsequent drawings (e.g., FIG. 9 and FIG. 10), a semiconductor layer may alternatively be arranged between the photodetector and the substrate 102, in which the coupler 108 and the core body 106 are both arranged upon the semiconductor layer.

The coupler 108 may be optically coupled to an optical component (not shown) and may be configured to receive light transmitted by the optical component. As shown, the coupler 108 includes a plurality of grating structures 112, each grating structure 112 having a width $w_1$. The respective widths $w_1$ of the plurality of grating structures 112 may vary as a function of position relative to the core body 106. The coupler 108 generally provides an array or matrix of structures on a two-dimensional surface with properties that differ from bulk properties, commonly referred to as a metamaterial.

Figure 1A:
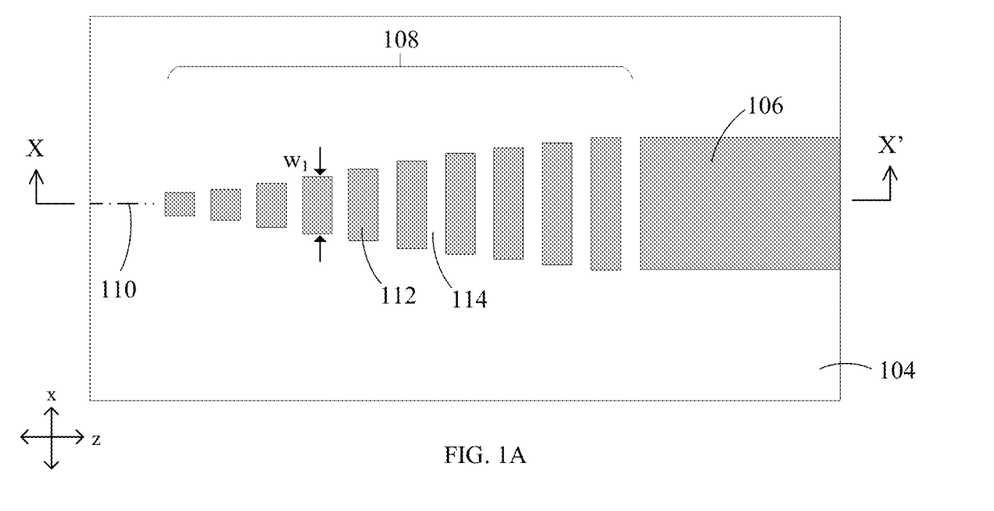
FIG. 1A, FIG. 1B, and FIG. 1C are plan views depicting embodiments of a structure in accordance with the present disclosure.
Figure 1B:
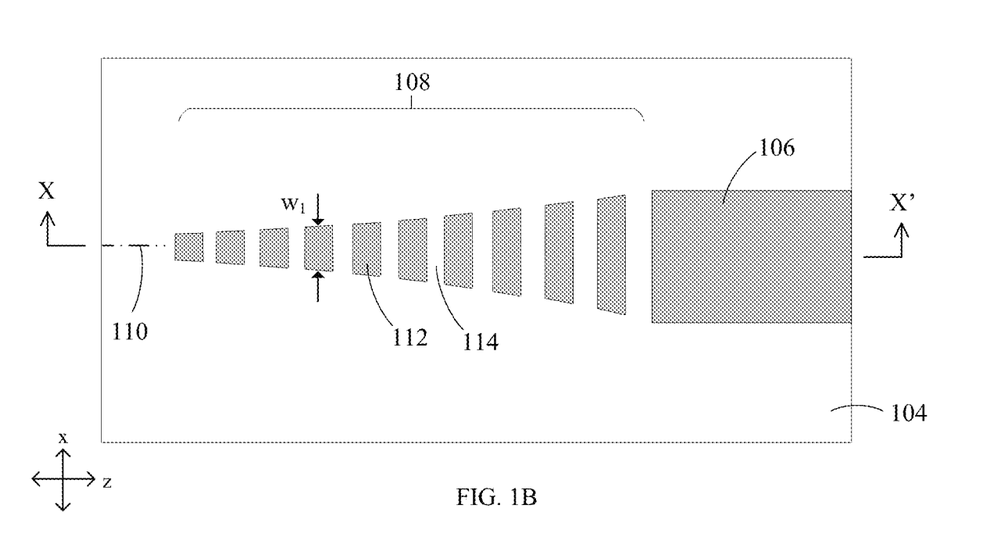
Figure 1C:
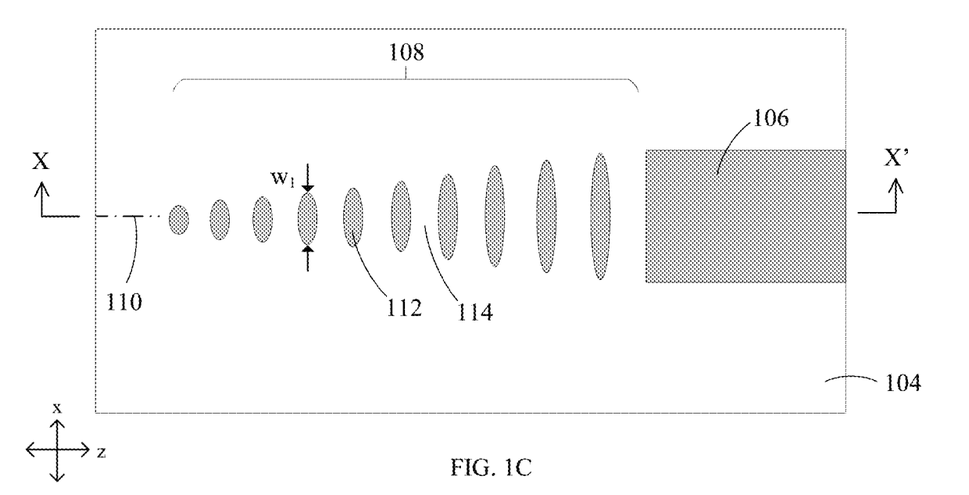

The respective widths $w_1$ of the plurality of grating structures 112 may vary with position relative to the core body 106 based on a mathematical function. For example, the widths in the plurality of grating structures 112 may be vary based on a linear function or a non-linear function in order to provide the variation with position relative to the core body 106. Exemplary non-linear functions include, but not limited to, parabolic function, exponential function, quadratic function, logarithmic function, and polynomial functions with a degree of at least 2. In some embodiments, the respective widths $w_1$ of the plurality of grating structures 112 may decrease (e.g., decrease in a linear manner or decrease in a non-linear manner) with increasing distance from the core body 106 such that the largest width occurs adjacent to the core body 106 and the smallest width occurs remote from the core body 106. The decreasing of the widths $w_1$ of the grating structures 112 with an increasing distance from the core body 106 may advantageously increase the coupling efficiency and reduce the back reflection of the electromagnetic waves propagated within the coupler 108.

As shown in FIGS. 1A through 1C, the grating structures 112 are separated by grooves 114. The grating structures 112 may have a given periodicity along the longitudinal axis 110 defined by a pitch and a filling factor or duty cycle. The pitch represents a distance along the longitudinal axis 110 between adjacent pairs of the grating structures 112, and the duty cycle represents a fraction of the total area of the coupler 108 that is occupied by the grating structures 112 as opposed to the grooves 114. In the representative embodiments, the grating structures 112 are periodic with a single pitch and duty cycle. Alternatively, in another embodiment (not shown), the grating structures 112 may be apodized (i.e., aperiodic) with a pitch and/or a duty cycle that varies along the longitudinal axis 110 as a function of position relative to the core body 106.

Various geometric shapes for each grating structure 112 may be contemplated within the scope of the present disclosure. In the embodiment shown in FIG. 1A, the grating structures 112 are rectangular features with substantially planar sidewalls and a rectangular cross-section in a direction normal to the top surface of the buried insulator layer 104. In the embodiment shown in FIG. 1B, the grating structures 112 may be trapezoidal features with substantially planar sidewalls and a trapezoidal cross-section in a direction normal to the top surface of the buried insulator layer 104. In the embodiment shown in FIG. 1C, the grating structures 112 may be oval-shaped features, each having a curved sidewall.

A semiconductor-on-insulator (SOI) wafer may be used to form the representative embodiment. The core body 106 and the coupler 108 may be concurrently formed by patterning the top semiconductor layer of the SOI wafer using patterning techniques. Alternatively, the top semiconductor layer of the SOI wafer may be removed to expose the underlying buried insulator layer 104. This is followed by depositing a uniformly thicker semiconductor material layer upon the buried insulator layer 104 with deposition techniques described herein, and subsequently, patterning the deposited semiconductor material layer with patterning techniques described herein to form the core body 106 and the coupler 108.

During the patterning stage, for example, an etch mask may be formed by a lithography process over the semiconductor layer, and unmasked sections of the deposited layer are etched and removed with an etching process, such as reactive ion etching. The etching process may be selected to stop on the material of the buried insulator layer 104 after penetrating fully through the deposited semiconductor material layer. Due to their concurrent formation from the same layer of semiconductor material, the core body 106 and the coupler 108 may be substantially coplanar with substantially coplanar top and bottom surfaces, or alternatively, the core body 106 and the coupler 108 may not be coplanar with each other. The semiconductor material used to form the core body 106 and the coupler 108 may be silicon or germanium containing compounds, such as germanium or silicon-germanium.

Figure 3:
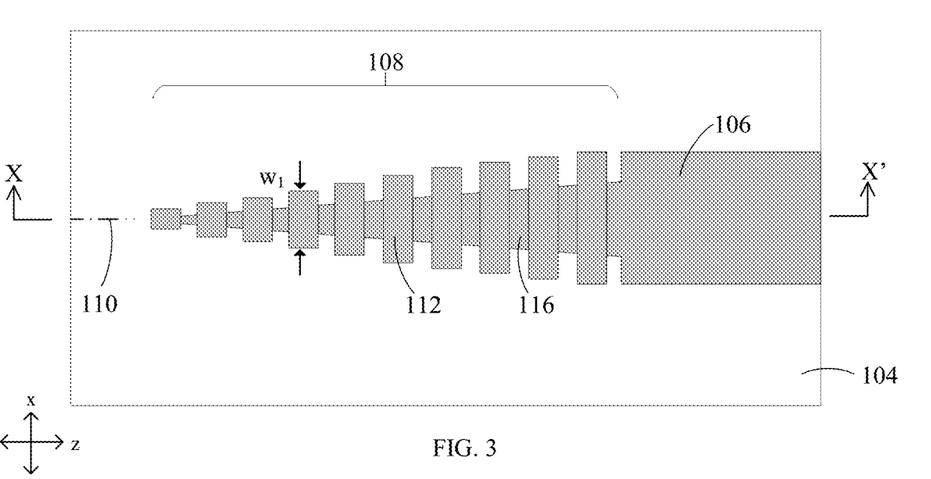
FIG. 3 is a plan view of another embodiment of a structure in accordance with the present disclosure.
Figure 4:
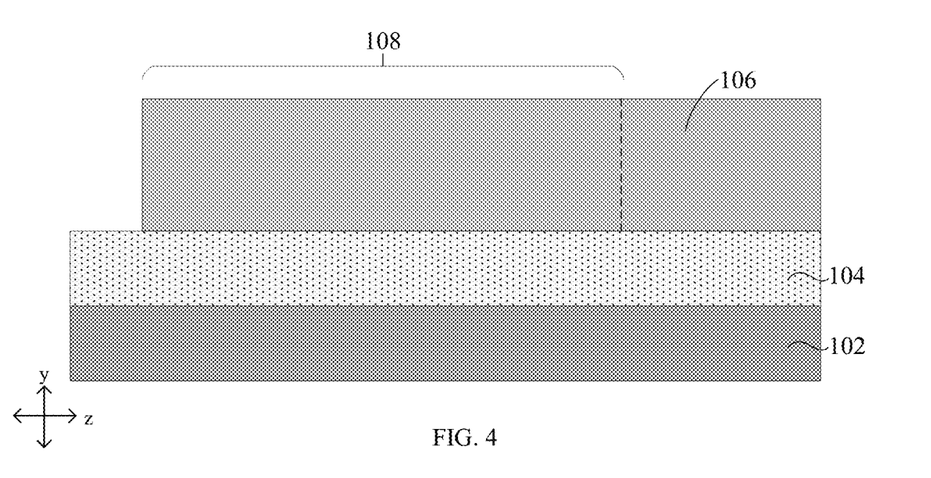
FIG. 4 is a cross-sectional view of the structure taken generally along cross-section line X-X' in FIG. 3, in accordance with the present disclosure.

With reference to FIG. 3 and FIG. 4, in which like reference numerals refer to like features in FIG. 1 and FIG. 2, another embodiment of a structure for use in optoelectronic/photonic applications is shown. The coupler 108 further includes a transition structure 116 that overlaps with the plurality of grating structures 112. The transition structure 116 may overlap with the plurality of grating structures 112 such that the transition structure 116 has segments that are arranged between adjacent pairs of the grating structures 112.

The grating structures 112 have widths $w_1$ that vary as a function of position relative to the core body 106. The transition structure 116 may be adjoined to and continuous with the core body 106 and may be tapered to widen in a direction towards the core body 106, i.e., an inverse taper. The tapering of the transition structure 116 may advantageously increase the coupling efficiency and reduce the back reflection of the electromagnetic waves propagated within the coupler 108.

The transition structure 116 and the plurality of grating structures 112 may be aligned or substantially aligned with the core body 106 along a longitudinal axis 110 of the photodetector. The coupler 108 and the core body 106 may be formed using similar techniques described in FIGS. 1A through 1C, and FIG. 2.

Advantageously, the overlapping of a transition structure 116 with the grating structures 112 may provide better modal overlap between the optical component and the photodetector. For example, if the mode properties of the sub-wavelength grating structures in the photodetector are significantly different from that of the optical component, then the embodiment in FIG. 3 and FIG. 4 may offer better mode transition for electromagnetic waves propagating between the optical component and the photodetector, when compared with the embodiment shown in FIGS. 1A through 1C, and FIG. 2.

Figure 5:
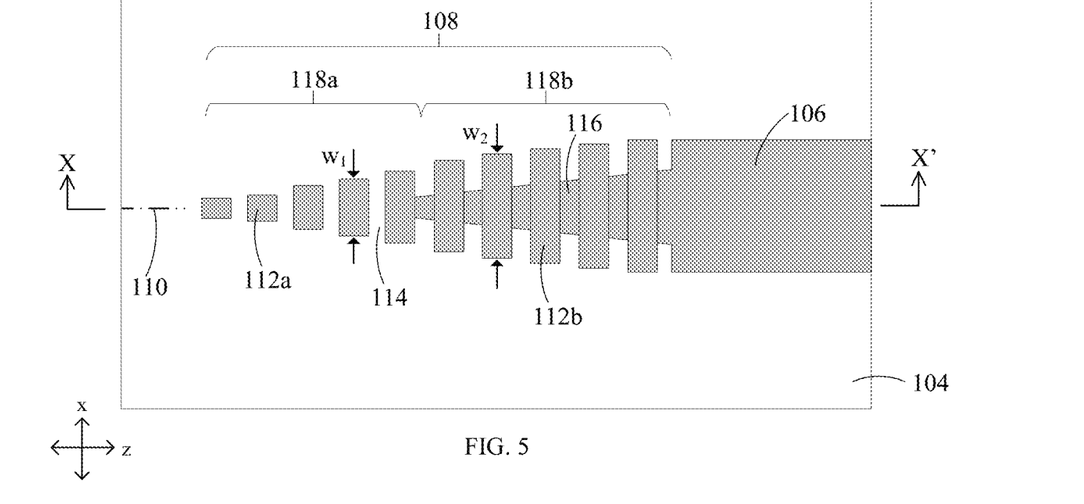
FIG. 5 is a plan view of another embodiment of a structure in accordance with the present disclosure.
Figure 6:
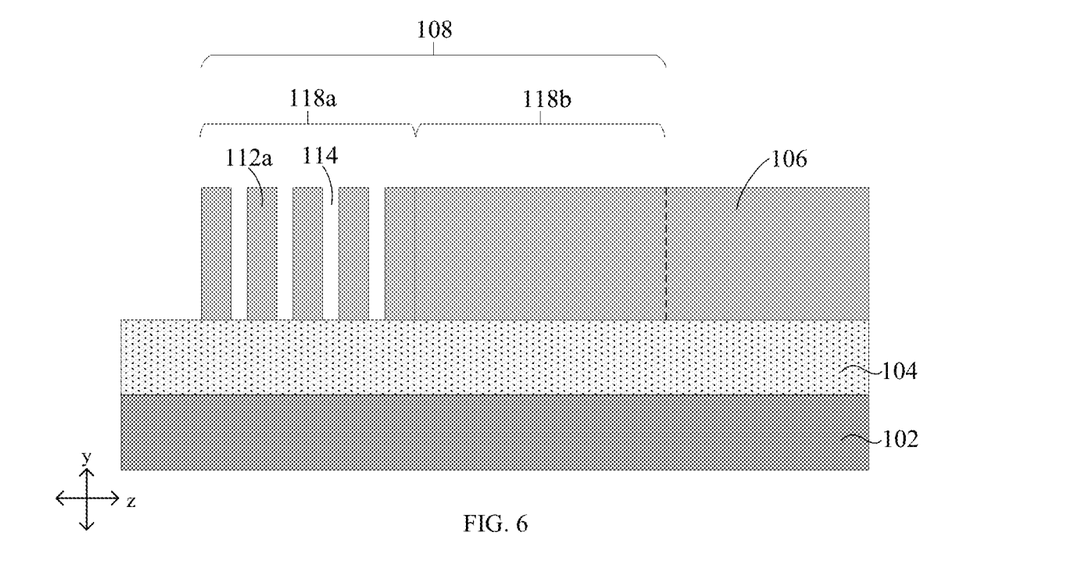
FIG. 6 is a cross-sectional view of the structure taken generally along cross-section line X-X' in FIG. 5, in accordance with the present disclosure.

Referring to FIG. 5 and FIG. 6, another embodiment of a structure for use in optoelectronic/photonic applications is shown. The coupler 108 of the photodetector may include multiple pluralities of grating structures. For example, in the representative embodiment, the coupler 108 includes a first plurality 118a of grating structures 112a and a second plurality 118b of grating structures 112b that is arranged between the first plurality 118a and the core body 106.

Each grating structure 112a in the first plurality 118a has a width $w_1$ and each grating structure 112b in the second plurality 118b has a width $w_2$. In the first plurality 118a of grating structures 112a, the respective widths $w_1$ varies as a function of position relative to the core body 106. In the second plurality 118b of grating structures 112b, the respective widths $w_2$ may vary as a function of position relative to the core body 106. In another embodiment (not shown), the widths $w_2$ of the grating structures 112b in the second plurality 118b may alternatively be constant and not vary.

The grating structures 112a in the first plurality 118a are separated by grooves 114 and the grating structures 112b in the second plurality 118b overlaps with a transition structure 116. Accordingly, the coupler 108 illustrated in FIG. 5 and FIG. 6 defines a hybrid taper. As shown, the transition structure 116 overlapping with the second plurality 118b of grating structures 112b may be adjoined to and continuous with the core body 106, and the transition structure 116 may be tapered to widen in a direction towards the core body 106 such that the transition structure 116 has the form of an inverse taper. The hybrid taper may provide additional reduction in mismatches in the mode profiles and mode indices during optical transmission or propagation of electromagnetic waves within the coupler 108.

In some embodiments, the respective widths $w_1$ of the first plurality 118a of grating structures 112a and the respective widths $w_2$ of the second plurality 118b of grating structures 112b may vary with position relative to the core body 106 based on a mathematical function, such as a linear function or a non-linear function described herein. For example, the widths $w_1$, $w_2$ may decrease (e.g., decrease in a linear manner or a non-linear manner) with increasing distance from the core body 106. In the embodiment shown in FIG. 5, the widths $w_1$ in the first plurality 118a and the widths $w_2$ in the second plurality 118b vary based on the same function. Alternatively, as will be shown in subsequent drawings, the widths $w_1$ in the first plurality 118a may vary based on a different function from which the widths $w_2$ in the second plurality 118b are based on.

The grating structures 112b in the second plurality 118b have a pitch that may be the same or different from the pitch of the grating structures 112a in the first plurality 118a, and the grating structures 112b also have a duty cycle that may be the same or different from the duty cycle of the grating structures 112a. In the representative embodiment, the grating structures 112a are periodic with a single pitch and duty cycle, and the grating structures 112b are periodic with a single pitch and duty cycle.

In the embodiment shown in FIG. 5, the grating structures 112a in the first plurality 118a have the same geometric shape as the grating structures 112b in the second plurality 118b. Alternatively (not shown), the grating structures 112a in the first plurality 118a have a different geometric shape from the grating structures 112b in the second plurality 118b.

The coupler 108 and the core body 106 illustrated in FIG. 5 and FIG. 6 may be formed upon the buried insulator layer 104 using similar techniques described in FIGS. 1A through 1C, and FIG. 2, for example, by patterning the top semiconductor layer of an SOI wafer using patterning techniques described herein.

Figure 7A:
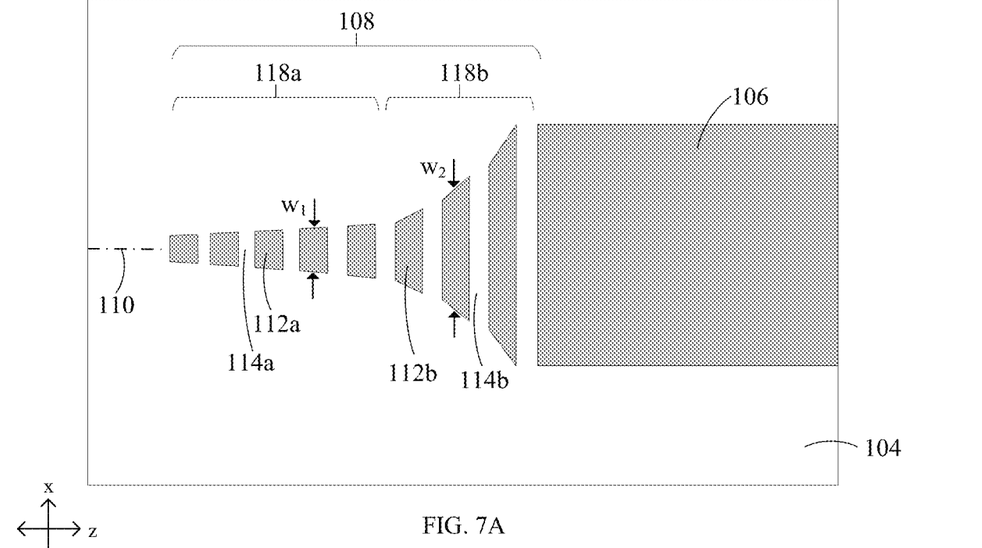
FIGS. 7A to 7C are plan views of other embodiments of structures in accordance with the present disclosure.
Figure 7B:
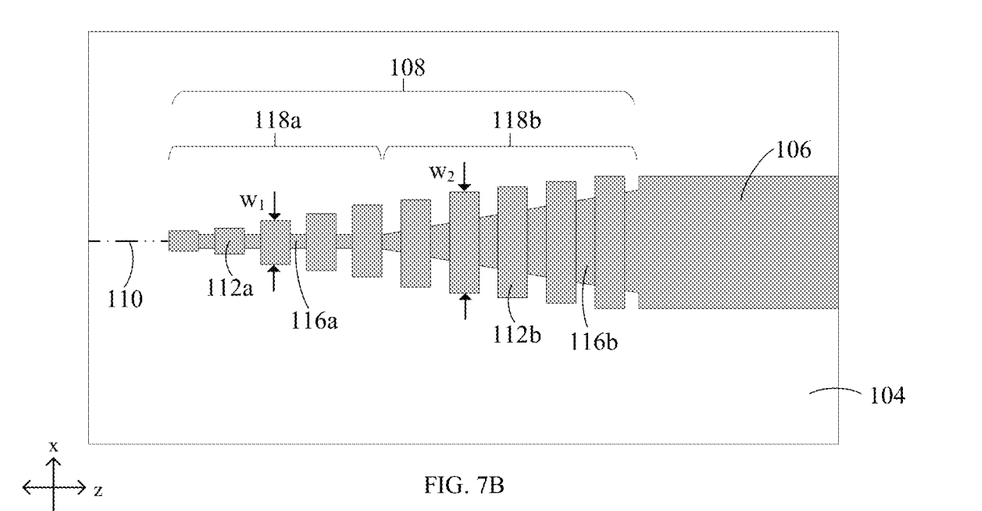
Figure 7C:
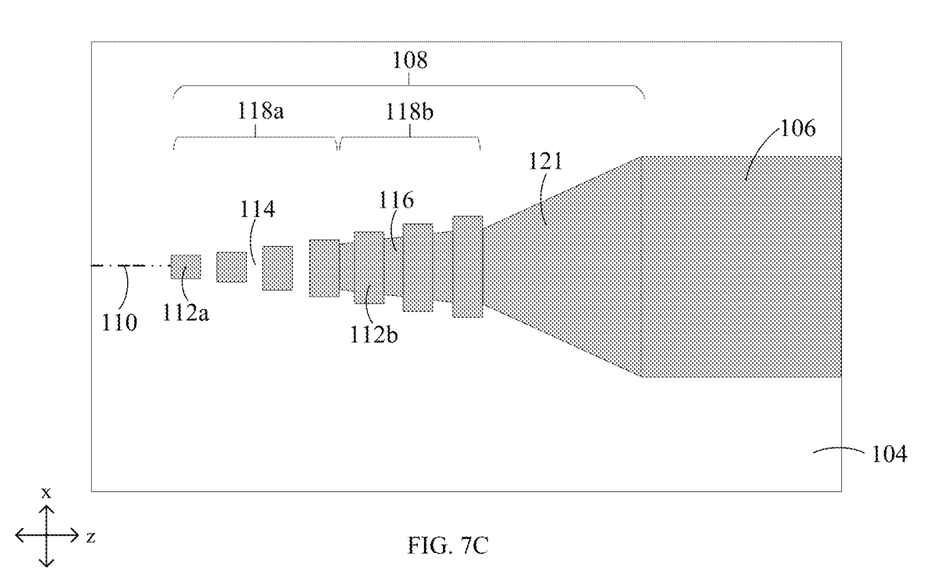

FIGS. 7A to 7C illustrates other embodiments of the structures contemplated within the scope of the present disclosure for use in optoelectronic/photonic applications. The embodiments illustrated in FIGS. 7A to 7C may be formed upon the buried insulator layer 104 using similar techniques described in FIGS. 1A through 1C, and FIG. 2.

Referring to FIG. 7A, the coupler 108 includes a first plurality 118a of grating structures 112a and a second plurality 118b of grating structures 112b arranged between the core body 106 and the first plurality 118a. The grating structures 112a in the first plurality 118a are separated by grooves 114a and the grating structures 112b in the second plurality 118b are separated by grooves 114b. In the embodiment shown in FIG. 7A, the widths $w_1$ in the first plurality 118a may vary based on a first mathematical function and the widths $w_2$ in the second plurality 118b may vary based on a second mathematical function. Although not shown, the present disclosure also contemplates alternative embodiments in which the widths $w_2$ in the second plurality 118b are constant and do not vary. Additionally, although FIG. 7A illustrates each grating structure as trapezoidal features, it should be understood that other geometric shapes described herein are also applicable.

Referring to FIG. 7B, the coupler 108 includes a first transition structure 116a that overlaps with the first plurality 118a of grating structures 112a and a second transition structure 116b that overlaps with the second plurality 118b of grating structures 112b. As shown, the first transition structure 116a has parallel or substantially parallel sides and the second transition structure 116b is tapered to widen in a direction towards the core body 106. The second transition structure 116b may be adjoined to and continuous with the core body 106. Additionally, the respective widths $w_1$, $w_2$ of the grating structures 112a, 112b vary as a function of position relative to the core body 106.

Referring to FIG. 7C, the coupler 108 includes a first plurality 118a of grating structures 112a, a second plurality 118b of grating structures 112b, and a tapered structure 121 arranged between the second plurality 118b of grating structures 112b and the core body 106. The tapered structure 121 may be tapered to increase in width in a direction towards the core body 106. The tapered structure 121 may be adjoined to and continuous with the core body 106 and the transition structure 116. The grating structures 112a in the first plurality 118a are separated by grooves 114 and the grating structure 112b in the second plurality 118b overlaps with the transition structure 116. Additionally, the respective widths w1, w2 of the grating structures 112a, 112b vary as a function of position relative to the core body 106.

Figure 8:
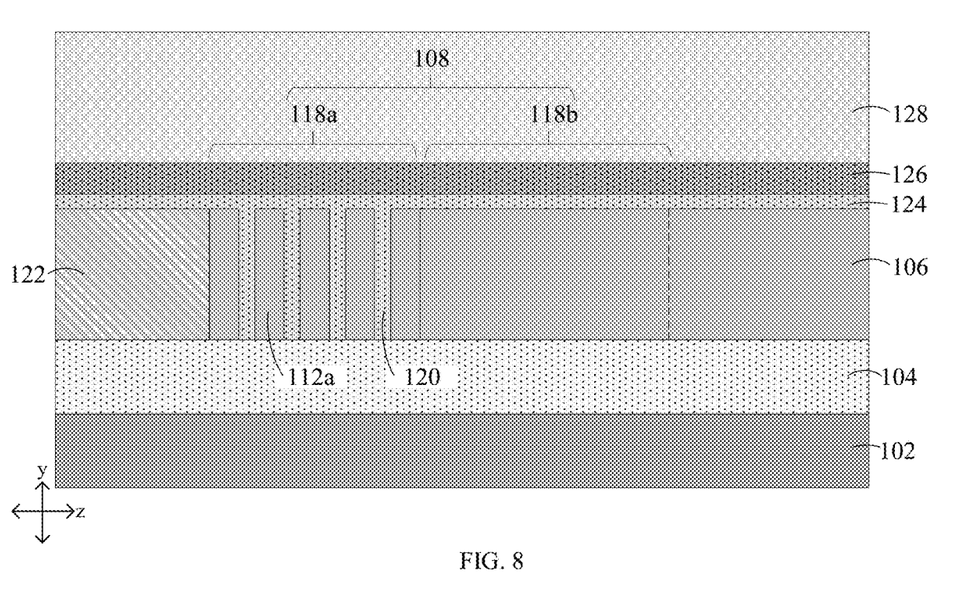
FIGS. 8 to 10 are cross-sectional views of embodiments of semiconductor devices in accordance with the present disclosure.
Figure 9:
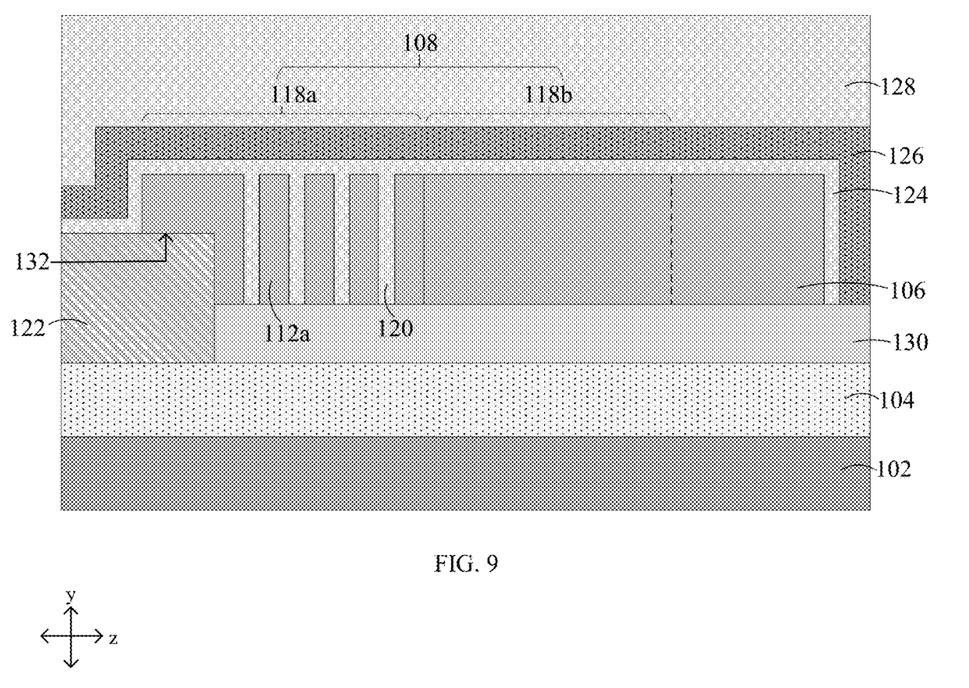
Figure 10:
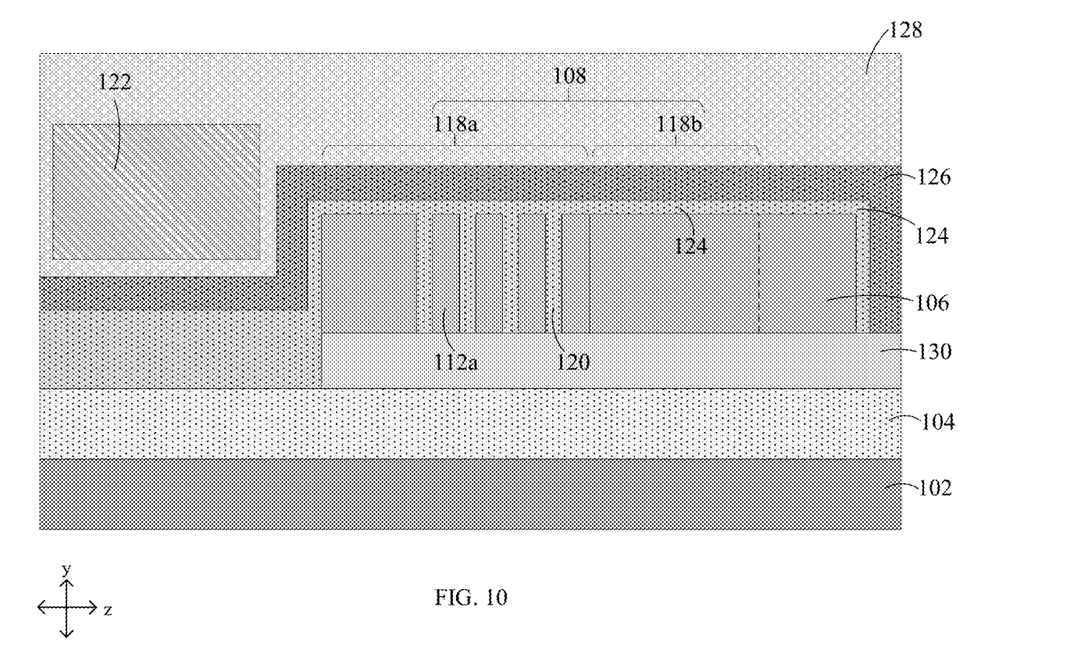

FIGS. 8 to 10 illustrate various embodiments of a semiconductor device integrated with the structures described herein and at a subsequent fabrication stage. For simplicity, each of the embodiments illustrated in FIGS. 8 to 10 is integrated with the coupler and the core body described in FIG. 5, however, it should be understood that the exemplary structures described in FIGS. 1A through 7C are also contemplated as being applicable to the embodiments of FIGS. 8 to 10.

With reference to FIG. 8, in which like reference numerals refer to like features in FIG. 6 and at a subsequent fabrication stage, the grooves between the grating structures 112a are filled or substantially filled with a dielectric material 120. The filling of the grooves with the dielectric material 120 may be performed using deposition techniques described herein, such as chemical vapor deposition. Examples of the dielectric material 120 may include, but not limited to, silicon dioxide ($SiO_2$), calcium fluoride ($CaF_2$), SiCOH, magnesium fluoride ($MgF_2$), and aluminum oxide ($Al_2O_3$). The dielectric material 120 also fills the open space between the grating structures associated with the transition structure in the second plurality 118b. In alternative embodiments (not shown), the deposited dielectric material 120 may contain air in the form of voids. Preferably, the grooves between the grating structures 112a are filled with a material having a refractive index in the range of 1.3 to 1.7.

An optical component 122 may be coupled to the first plurality 118a of grating structures 112a by being positioned adjacent thereto. The optical component 122 may be aligned with the core body 106 and the coupler 108 along the longitudinal axis of the photodetector. The coupler 108 may provide bidirectional in-plane optical coupling between the core body 106 and the optical component 122 of different spot sizes.

Exemplary optical components may include waveguides, splitters, bends, tapers, and fibers. In some embodiments, the optical component 122 is a waveguide. The waveguide may be made of either a semiconductor material or a dielectric material. Examples of the semiconductor material in the waveguide may include, but limited to, III-V compound semiconductors, amorphous silicon, polycrystalline silicon, amorphous germanium, polycrystalline germanium, amorphous SiGe, or polycrystalline SiGe. Examples of the dielectric material in the waveguide may include, but not limited to, silicon nitride (SiN), silicon oxynitride (SiON), aluminum nitride (AlN) or other nitride-containing compounds.

Dielectric layers 124, 126 may be formed over and covering the optical component 122 and the photodetector. The dielectric layers 124, 126 may provide protection for the photodetector against chemical damage.

The dielectric layer 124 may be disposed upon the photodetector and the optical component 122 and may have a refractive index in the range of about 1.4 to about 2, and preferably about 1.4 to about 1.7. The dielectric layer 126 may have a preferred refractive index in the range of about 1.7 to about 2.2. A cladding structure 128 may be formed over the dielectric layers 124, 126. The cladding structure 128 may function as an interlayer dielectric to provide electrical insulation from other device components in an IC. The cladding structure 128 may include either a single cladding layer or multiple dielectric cladding layers. For example, the cladding structure 128 may include multiple layers of silicon dioxide.

With reference to FIG. 9, in which like reference numerals refer to like features in FIG. 8, the coupler 108 and the core body 106 are formed upon a semiconductor layer 130. The semiconductor layer 130 may be formed by patterning the top semiconductor layer of an SOI wafer using patterning techniques described herein. The coupler 108 and the core body 106 may be formed upon the semiconductor layer 130 by epitaxial growth (such as molecular beam epitaxy (MBE), liquid phase epitaxy, vapor phase epitaxy, or solid phase epitaxy), rapid melt growth, and/or deposition of a semiconductor material layer, followed by patterning the semiconductor material layer. In some embodiments, the semiconductor layer 130 is a silicon layer upon which a germanium containing material layer (e.g., germanium or silicon-germanium) is deposited, followed by performing a patterning process on the germanium containing material layer to form the coupler 108 and the core body 106.

The semiconductor layer 130 may serve as active regions by providing an electrical pathway for current flow. Although not shown in the accompanying drawings, the semiconductor layer 130 may include doped regions. Electrical contacts (not shown) may be formed above the doped regions to provide electrical interconnections to other device components in a semiconductor device.

As shown in FIG. 9, the optical component 122 is positioned adjacent to the first plurality 118a of grating structures 112a. In the representative embodiment, an edge of the coupler 108 overlaps with a region 132 located at an edge of the optical component 122 so as to enhance the modal overlap and transition of electromagnetic waves between the two components. In an alternative embodiment (not shown), there is no overlap between the coupler 108 and the optical component 122, and instead, the edge of the coupler 108 abuts the edge of the optical component 122.

Similar to the embodiment illustrated in FIG. 8, the grooves between the grating structures 112a are filled or substantially filled with a dielectric material 120. Dielectric layers 124, 126 may be formed over and covering the coupler 108, the core body 106 and the optical component 122. A cladding structure 128 may be formed over the dielectric layer 124, 126.

Referring to FIG. 10, in which like reference numerals refer to like features in FIG. 9, another example of configuring the photodetector with the optical component 122 is shown. In FIG. 10, the coupler 108 and the core body 106 are covered by the dielectric layers 124, 126 while the optical component 122 is located above the dielectric layers 124, 126 and is embedded within the cladding structure 128. The optical component 122 is coupled to the coupler 108 by being positioned adjacent to the first plurality 118a of grating structure 112a. As shown, the dielectric layer 124, 126 is between an edge of the optical component 122 and an edge of the coupler 108. The coupling configuration between the coupler 108 and the optical component 122 illustrated in FIGS. 8 to 10 may be referred to as "butt-end coupling".

The embodiments illustrated in FIGS. 8 to 10 may be modified to eliminate the dielectric layers 124, 126 that only the cladding structure 128 covers the optical component 122 and the photodetector. Embodiments having such a modification may offer the advantage of removing a processing step.

Figure 2:
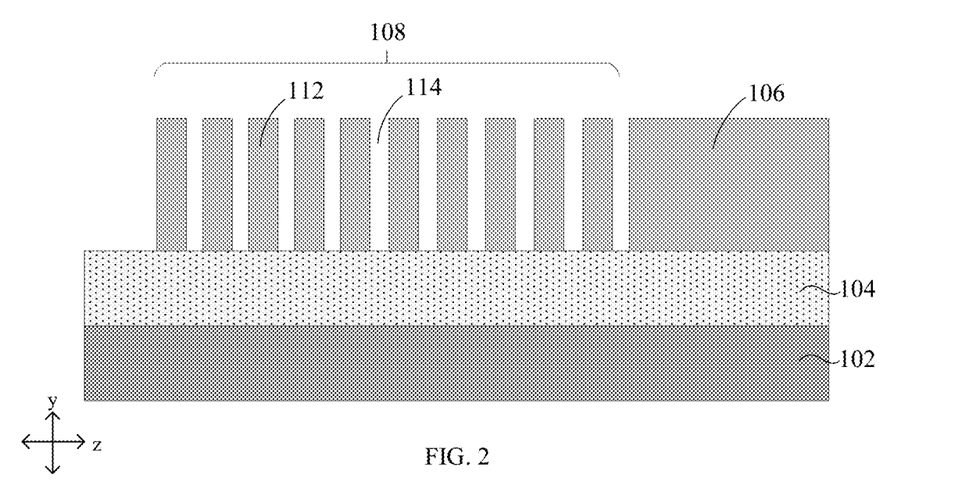
FIG. 2 is a cross-sectional view of the structure taken generally along cross-section line X-X' in FIG. 1A, FIG. 1B, or FIG. 1C, in accordance with the present disclosure.

Additionally, it should be understood that the arrangements illustrated in FIG. 9 and FIG. 10 having the core body 106 and the coupler 108 being disposed upon the semiconductor layer 130 are also contemplated as being applicable to the embodiments shown in FIG. 2, FIG. 4, and FIG. 6.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

Throughout this disclosure, the terms top, upper, upwards, over, and above refer to the direction away from the substrate. Likewise, the terms bottom, lower, downwards, under, and below refer to the direction towards the substrate. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many conventional processes are only mentioned briefly herein or omitted entirely without providing the well-known process details.

As will be readily apparent to those skilled in the art upon a complete reading of the present application, the semiconductor devices and methods disclosed herein may be employed in manufacturing a variety of different integrated circuit products and modules, including, but not limited to, CMOS devices, optoelectronic modules, LIDAR instrumentation and LIDAR systems, etc.

What is claimed is:

1. A structure comprising:
    a substrate;
    a photodetector arranged above the substrate, the photodetector having a core body and a coupler that is adjacent to the core body, wherein the core body is configured to absorb light received by the coupler; and
    the coupler comprising a plurality of grating structures having respective widths that vary as a function of position relative to the core body, wherein the respective widths of the plurality of grating structures decrease in width with increasing distance from the core body.

2. The structure of claim 1, wherein the coupler further includes a transition structure that overlaps with the plurality of grating structures.

3. The structure of claim 2, wherein the transition structure is tapered to widen in a direction towards the core body.

4. The structure of claim 1, wherein the respective widths of the plurality of grating structures vary with position relative to the core body based on a mathematical function.

5. The structure of claim 1, further comprising a semiconductor layer arranged between the photodetector and the substrate, wherein the coupler and the core body are disposed upon the semiconductor layer.

6. A structure comprising:
    a substrate;
    a photodetector arranged above the substrate, the photodetector having a core body and a coupler that is adjacent to the core body, wherein the core body is configured to absorb light received by the coupler; and
    the coupler comprising a first plurality of grating structures and a second plurality of grating structures arranged between the first plurality of grating structures and the core body, the first plurality of grating structures having respective widths that vary as a function of position relative to the core body.

7. The structure of claim 6, wherein the coupler further includes a transition structure that overlaps with the second plurality of grating structures.

8. The structure of claim 7, wherein the transition structure is tapered to widen in a direction towards the core body.

9. The structure of claim 6, wherein the coupler further includes a first transition structure that overlaps with the first plurality of grating structures and a second transition structure that overlaps with the second plurality of grating structures, the first transition structure having parallel sides and the second transition structure is tapered to widen in a direction towards the core body.

10. The structure of claim 6, wherein the second plurality of grating structures has equal widths.

11. The structure of claim 6, wherein the second plurality of grating structures has respective widths that vary as a function of position relative to the core body.

12. The structure of claim 11, wherein the respective widths of the first plurality of grating structures and the respective widths of the second plurality of grating structures decrease in width with increasing distance from the core body.

13. The structure of claim 11, wherein the respective widths of the first plurality of grating structures vary with position relative to the core body based on a first mathematical function and the respective widths of the second plurality of grating structures vary with position relative to the core body based on a second mathematical function.

14. The structure of claim 6, wherein the coupler further includes a tapered structure arranged between the second plurality of grating structures and the core body, the tapered structure increases in width in a direction towards the core body.

15. A semiconductor device comprising:
a substrate;
a photodetector arranged above the substrate, the photodetector having a core body and a coupler that is adjacent to the core body, wherein the core body is configured to absorb light received by the coupler;
the coupler comprising a plurality of grating structures having respective widths that vary as a function of position relative to the core body, wherein the respective widths of the plurality of grating structures decrease in width with increasing distance from the core body; and
an optical component arranged above the substrate and adjacent to the photodetector, wherein the coupler receives light transmitted by the optical component.

16. The device of claim 15, wherein the optical component is a waveguide.

17. The device of claim 16, wherein the waveguide includes a semiconductor material or a dielectric material.

18. The device of claim 15, further comprising a semiconductor layer arranged between the photodetector and the substrate, wherein the photodetector is disposed upon the semiconductor layer.

19. The device of claim 18, wherein the photodetector includes a germanium containing compound.

20. The structure of claim 4, wherein the mathematical function is either a linear function or a non-linear function.

* * * * *